(12) United States Patent
Singh et al.

(10) Patent No.: US 9,259,819 B2
(45) Date of Patent: Feb. 16, 2016

(54) CMP METHOD FOR FORMING SMOOTH DIAMOND SURFACES

(71) Applicants: SINMAT, INC., Gainesville, FL (US); UNIVERSITY OF FLORIDA RESEARCH FOUNDATION, INC., Gainesville, FL (US)

(72) Inventors: Rajiv K. Singh, Newberry, FL (US); Deepika Singh, Newberry, FL (US); Arul Chakkaravarthi Arjunan, Gainesville, FL (US)

(73) Assignees: Sinmat, inc., Gainesville, FL (US); University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 14/494,276

(22) Filed: Sep. 23, 2014

(65) Prior Publication Data
US 2015/0027981 A1   Jan. 29, 2015

Related U.S. Application Data

(62) Division of application No. 13/669,955, filed on Nov. 6, 2012.

(51) Int. Cl.
| | | |
|---|---|---|
| B24B 29/02 | (2006.01) | |
| B32B 33/00 | (2006.01) | |
| H01L 21/321 | (2006.01) | |
| H01L 21/306 | (2006.01) | |
| C09K 3/14 | (2006.01) | |

(Continued)

(52) U.S. Cl.
CPC . *B24B 29/02* (2013.01); *B28D 5/00* (2013.01); *B32B 33/00* (2013.01); *C09G 1/02* (2013.01); *C09K 3/1463* (2013.01); *C30B 29/04* (2013.01); *C30B 33/00* (2013.01); *H01L 21/30625* (2013.01); *H01L 21/31111* (2013.01); *H01L 21/3212* (2013.01); *H01L 29/1602* (2013.01); *H01L 29/1608* (2013.01); *H01L 29/2003* (2013.01); *Y10T 428/31* (2015.01)

(58) Field of Classification Search
CPC ............... H01L 21/30625; H01L 21/3212; C09G 1/02
See application file for complete search history.

(56) References Cited

U.S. PATENT DOCUMENTS

| | | |
|---|---|---|
| 5,373,171 A | 12/1994 | Imai et al. |
| 5,565,724 A | 10/1996 | Hachigo et al. |

(Continued)

OTHER PUBLICATIONS

D. W. Palmer, Properties of Diamond, Silicon and Germanium, www.semiconductors.co.uk, 2014 (link http://www.semiconductors.co.uk/propiviv5431.htm).

(Continued)

*Primary Examiner* — Duy Deo
(74) *Attorney, Agent, or Firm* — Jetter & Associates, P.A.

(57) ABSTRACT

A method of chemical mechanical polishing (CMP) a diamond containing surface includes providing a slurry including a plurality of particles, at least one oxidizer, and at least one acid, wherein the slurry has a pH≤3 or pH greater than 11. At least an outer surface of the plurality of particles is softer than the diamond surface or the particles are diamond particles averaging less than (<) 2 μm in size. The diamond surface is pressed with respect to a polishing pad providing a Shore D Hardness less than 99 having the slurry in between while rotating the polishing pad relative to the diamond surface to form a smooth diamond surface having a root mean square (rms) surface roughness less than 15 nm.

12 Claims, 2 Drawing Sheets

(51) Int. Cl.
  *C09G 1/02* (2006.01)
  *H01L 21/311* (2006.01)
  *B28D 5/00* (2006.01)
  *C30B 29/04* (2006.01)
  *C30B 33/00* (2006.01)
  *H01L 29/16* (2006.01)
  *H01L 29/20* (2006.01)

(56) References Cited

U.S. PATENT DOCUMENTS

| | | |
|---|---|---|
| 5,576,589 A | 11/1996 | Dreifus et al. |
| 6,320,296 B1 | 11/2001 | Fujii et al. |
| 6,676,487 B1 | 1/2004 | Adachi |
| 7,098,490 B2 | 8/2006 | Micovic et al. |
| 8,183,086 B2 | 5/2012 | Sung |
| 2003/0062335 A1 | 4/2003 | Brewer |
| 2005/0113011 A1* | 5/2005 | Miyauchi et al. ............ 451/527 |
| 2007/0228873 A1 | 10/2007 | Lin et al. |
| 2008/0149884 A1* | 6/2008 | Siddiqui et al. ............ 252/79.2 |
| 2009/0302266 A1* | 12/2009 | Takemura et al. ............ 252/79.1 |
| 2011/0306209 A1 | 12/2011 | Ishibashi |

OTHER PUBLICATIONS

Silicon Systems Group, Applied Materials—Black Diamond 3 PECVD System, Jul. 12, 2011.

H.P.R. Frederikse, Permittivity (Dielectric Constant) of Inorganic Solids, CRC Handbook of Chemistry and Physics, 1997-1998, 78th Edition, p. 12-48-12-49.

* cited by examiner

PROVIDING A SLURRY COMPRISING A PLURALITY OF PARTICLES, AT LEAST ONE OXIDIZER, AND AT LEAST ONE ACID OR BASE, WHEREIN THE SLURRY HAS A PH LESS THAN OR EQUAL TO (≤) 3 OR GREATER (>) THAN 11. AT LEAST AN OUTER SURFACE OF THE PLURALITY OF PARTICLES IS SOFTER THAN THE DIAMOND CONTAINING SURFACE BEING POLISHED, OR THE PARTICLES ARE DIAMOND PARTICLES AVERAGING LESS THAN (<) 2 μM IN SIZE. —— 101

PRESSING THE DIAMOND SURFACE WITH A POLISHING PAD PROVIDING A SHORE D HARDNESS LESS THAN 99 HAVING THE SLURRY IN BETWEEN WHILE ROTATING THE POLISHING PAD RELATIVE TO THE DIAMOND SURFACE TO FORM A SMOOTH DIAMOND SURFACE HAVING A ROOT MEAN SQUARE (RMS) SURFACE ROUGHNESS LESS THAN (<) 15 NM. —— 102

CMP METHOD FOR FORMING SMOOTH DIAMOND SURFACES

CROSS-REFERENCE TO RELATED APPLICATIONS

This application is a divisional application of U.S. Non-Provisional patent application Ser. No. 13/669,955 filed Nov. 6, 2012, entitled "SMOOTH DIAMOND SURFACES AND CMP METHOD FOR FORMING".

FIELD

Disclosed embodiments relate to chemical mechanical polishing (CMP) of diamond surfaces to form smooth diamond surfaces and electronic devices that include at least one smooth diamond surface layer.

BACKGROUND

Diamond is an allotrope of carbon, where the carbon atoms are arranged in a face-centered cubic crystal structure called a diamond lattice. Crystalline diamond can be classified based on grain size into super nano-crystalline (grain size less than 10 nm), nano-crystalline (grain size between 10 nm and 250 nm), micro-crystalline (grain size from 250 nm to 250 microns) and single crystalline diamond (grain size greater than 250 microns). The diamond can exist in thin films (film thickness less than 20 microns), thick films (film thickness greater than 20 microns to 200 microns), or bulk materials (thickness greater than 200 microns). Diamond films and bulk materials can coexist with graphitic sp2 phases. Single crystal diamond films can have (100), (110), (111), or other crystal orientations.

Diamonds are adapted for many uses because of exceptional physical characteristics. Notable are its extreme hardness and high thermal conductivity (900 to 2,320 $W \cdot m^{-1} \cdot K^{-1}$), as well as a wide bandgap and high optical dispersion. The thermal conductivity of diamond is significantly higher than any other known material, which makes diamond thin film substrates an ideal choice for thermal challenges posed by applications including (1) miniaturization of electronic devices, (2) high brightness light emitting diodes (LEDs), (3) laser diodes and (4) high power (e.g., 500 $W/mm^2$)/high frequency devices, (5) high frequency devices, and (6) acoustic devices. Applications well-suited for diamond layers include MEMS (micro electro mechanical structures), NEMS (nano electro mechanical structures) and diamond-based power electronic devices. Diamond can also be used for conditioning the pads in chemical mechanical polishing (CMP) processing, or as a cutting tool material.

To harness the unique properties of diamond, in applications such as for electronics, it is desirable to have ultra-smooth diamond surfaces since ultra-smooth surfaces decrease friction, increase thermal conductivity, and improve integration compatibility. The applications will generally depend on a combination of properties. For example, application of diamond as a substrate for electronic packaging takes advantage of its very high thermal conductivity for efficient heat dissipation, very high electrical resistivity for excellent electrical insulation and low permeability for environmental protection of the devices.

However, despite its desirability, ultra-smooth diamond surfaces have remained an unmet need. As known in the art, as-deposited low pressure vapor phase diamond films are very rough, with a typical average surface roughness of at least 4 nm up to several hundred microns, depending on the thickness of the film and the grain size of the film.

Traditional CMP methods have not generally been suitable for polishing of diamond films. This is primarily because of the extreme hardness and chemical inertness of diamond, which results in standard chemistries and particle-based CMP achieving very low or essentially no removal rate for diamond. Non-CMP methods have also been disclosed for planarization of diamond, including (1) laser polishing (2) ion beam polishing, (3) polishing using molten salts, and (4) diamond-diamond abrading. Such methods are neither cost-effective, nor viable for manufacturability at an industrial level. Further, such processes do not reduce the average surface roughness to a level suitable for use in semiconductor device manufacturing, such as <20 nm root mean square (rms). Moreover, the use of diamond particles without chemical additives can create sub-surface damage which can result in poor quality epitaxial growth thereon and reduced thermal conductivity.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include chemical mechanical polishing (CMP)-methods for processing diamond surfaces that provide smooth diamond surfaces. A smooth diamond surface is defined herein as having: (i) a root mean square (rms) surface roughness less than (<) 15 nm for an average grain size greater than (>) 0.5 µm, an rms surface roughness less than (<) 10 nm for an average grain size between 50 nm and 0.5 µm, and an rms surface roughness less than (<) 5 nm for an average grain size less than (<) 50 nm, and (ii) a polishing damage index (PDI) of less than (<) $10^9/cm^2$.

The smooth diamond surface can be on a diamond film/layer with a thickness ranging from 10 nm to 200 microns, or on a bulk single crystal diamond material with a thickness exceeding 200 microns. As used herein, the diamond material is in the form of a thin film if the thickness is less than 20 microns, and is in the form of a thick film if the thickness is between 20 microns to 200 microns.

The diamond surface can also be in form of composite, for example >0.2 micron size diamond particles on the surface of a metallic, ceramic or polymeric matrix. In this case the diamond particles can protrude from the surface of the matrix. Such systems may be used as pad conditioners for CMP processing. Another example of a composite is a mixture of diamond particle embedded in metals, ceramics, or polymers. Examples include, but are not limited to, diamond-cobalt, diamond-tungsten carbide (WC), and diamond-silicon carbide composites. The diamond particles can be of an average size greater than (>) 0.2 µm.

During CMP the diamond surface in either film, bulk or composite form is generally pressed on the polishing pad having the slurry between the diamond surface and the polishing pad while rotating or moving the polishing pad relative to the diamond surface to form a smooth diamond surface. The polishing pad can comprise a metal, ceramic, or a soft polymer including a resin, or a composite mixture of these materials. In one embodiment the polishing pad can be a soft cloth or woolen pad, or soft polymeric pad, each with a Shore D Hardness less than 99.

The slurry includes a plurality of slurry particles that can comprise particles softer than diamond, have at least an outer surface softer than diamond (e.g., diamond particles coated with a softer surface), or the particles can comprise diamond particles averaging less than (<) 2 μm in size. The slurry also includes at least one oxidizer, and at least one acid or base, where the slurry has a pH≤3 or a pH≥11.

BRIEF DESCRIPTION OF THE DRAWINGS

FIG. 1 is a flow chart that shows steps in an example method of CMP of diamond surfaces to form smooth diamond surfaces, according to an example embodiment.

DETAILED DESCRIPTION

Figure 2:
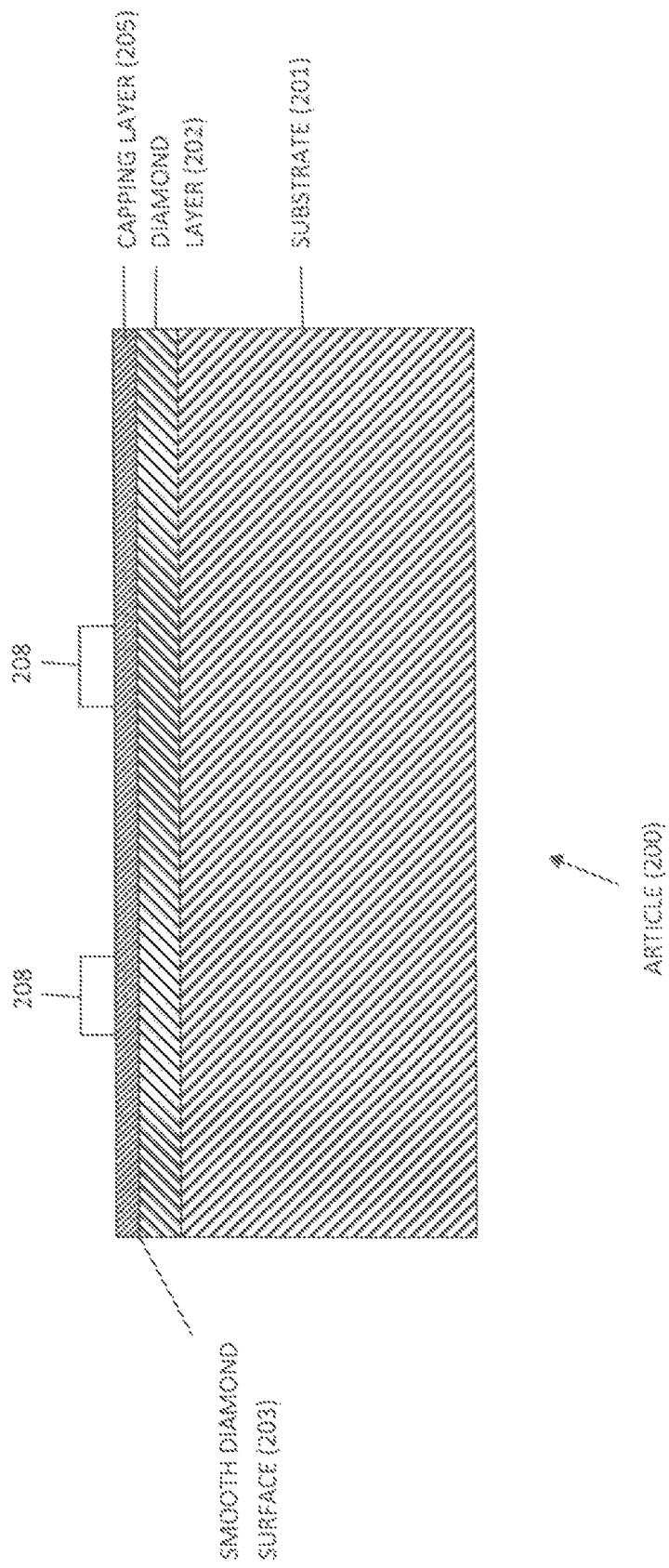
FIG. 2 is a cross sectional depiction of an article comprising a substrate, a diamond layer having a smooth diamond surface on the substrate, and a diamond or semiconductor layer on the smooth diamond surface, according to an example embodiment.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

Disclosed embodiments include CMP-based methods/processes for polishing of diamond surfaces to form smooth diamond surfaces. Embodiments can be applied to form smooth diamond surfaces from diamond single crystal substrates, or diamond films including super-nanocrystalline diamond (SNCD) (i.e. average grain size under 10 nm), nanocrystalline diamond grain size (i.e., average grain size 10 to 250 nm), microcrystalline diamond (i.e. average grain size 250 nm to 250 microns), or single crystal diamond films (with grain size greater than 250 microns). The texture of the grains can be random, textured or single crystal with a single orientation. A typical average initial (pre-CMP) root mean square (rms) surface roughness of the diamond surfaces polished by disclosed CMP polishing is at least 5 nm to 20 nm to several microns, with larger grain sizes tending to be somewhat initially rougher as compared to smaller grain sizes.

The diamond surface to be polished can either be in the form of layers/films with thickness ranging from 10 nm to 200 microns, or bulk materials with thickness exceeding 200 microns. The diamond surface is in the form of a thin film if the thickness is less than 18 micron or is in the form of a thick film if the thickness is between 20 microns to 200 microns. The single crystal diamond material can be in orientations including (100), (111), (110), or other crystal orientations. The single crystal materials may initially have a relatively low surface roughness, however, it may contain significant initial internal sub-surface damage due to mechanical polishing of the material.

The diamond surface can be in form of composite for example, >0.2 micron size particles on surface of a metallic matrix. In this case the diamond particles can protrude from the surface. Such systems can be used as pad conditioners for CMP processes. Other examples of disclosed composites can include a mixture of diamond particle embedded in metals, ceramics, or polymers. Examples include, but are not limited to, diamond-cobalt, diamond-tungsten carbide (WC), diamond-silicon carbide.

Disclosed embodiments include CMP methods for processing diamond surfaces that provide smooth diamond surfaces. As noted above, the diamond surfaces can either be in form of a thin or thick film, polycrystalline, single crystal bulk material or composite material. The diamond surface is pressed with respect to a metal, ceramic or polymeric polishing pad having a slurry including particles and an oxidizer between the diamond surface and the polishing pad while rotating the polishing pad relative to the diamond surface to polish the diamond surface, vice versa, or rotating both simultaneously. At least an outer surface of the slurry particles and the pad can both be softer than diamond. However, as noted above, the particles can also be uncoated diamond particles averaging less than (<) 2 μm in size.

An unexpected result provided by disclosed methods is CMP with high diamond removal rates (e.g., ≥20 nm/hr) using slurry particles where at least an outer surface of the particles is softer than the diamond surface, or the particles are diamond particles averaging less than (<) 2 μm in size. Diamond coated particles can be mixed with other particles. Examples of non-diamond particles include alumina, silicon carbide, silica, sapphire, quartz, other oxides, and nitrides.

The unexpected ability to polish diamond surfaces with materials softer than diamond, or by coated diamond particles that have surfaces softer than diamond, or by diamond particles averaging less than (<) 2 μm in size, is believed to be due to catalytic nature of disclosed polishing process, where the oxidizing agent catalytically breakdowns during CMP to provides in-situ reactive species. The polishing rate of diamond surfaces using a coated diamond particle slurry containing an oxidizer and an acid or base as disclosed herein being higher as compared to using similar diamond particles can also be attributed to the catalytic breakdown of the oxidizing agent during CMP.

FIG. 1 is a flow chart that shows steps in an example method 100 of chemical mechanical polishing (CMP) of diamond surfaces to form smooth diamond surfaces, according to an example embodiment. Step 101 comprises providing a slurry comprising a plurality of particles, where at least an outer surface of the particles is softer than the diamond surface or the particles are diamond particles averaging less than (<) 2 μm in size, at least one oxidizer, and at least one acid or base. The slurry has a pH less than or equal to (≤5), or greater than or equal to (≥) 11. The pH is generally from 1.5 to 3, or from 11 to 13.

The slurry particles can have an average particle size of ≤500 μm. The slurry particles can comprise alumina, titania or silica particles. The slurry particles can comprise coated diamond particles, or particles which are softer than diamond such as silica, alumina, boron carbide (BC), boron nitride (BN), or mixtures of these particles.

Polishing with coated diamond particles in the slurry even in presence of chemical additives may result in surface damage in the form of scratches or sub-surface damage below the surface of the diamond polished surface. The surface damage can manifest as scratches and other microstructural defects, such as dislocations, stacking faults, surface pits, that is created by the CMP process itself. Such defects tend to lie from 0.5 microns to 5 microns from the top surface. Thus, due to polishing, the density of defects in the near surface regions (up to 5 microns) is higher than the bulk of the material. The elimination of these defects represents removal of sub-surface damage. Such sub-surface damage is of importance in large grained (grain size >0.5 micron to several mm) polycrystal, or single crystal diamond materials. To eliminate or substantially reduce these defects, the slurry can comprise particles which are softer than diamond or diamond particles that have an outer surface coated with a softer phase material as compared to diamond.

To quantify the polishing damage, a polishing damage index (PDI) is used herein. PDI is defined by the following equation:

$$PDI = A - B \text{ (in units of \#/cm}^2),$$

where A=average projected surface density of defects (dislocations, scratches, pits, stacking faults, etc.) in the top "y" microns of thickness from the diamond surface being polished, and B is the average projected surface defect density at a distance "y" microns from the surface of the diamond layer. The distance "y" leads is typically is "2" microns when the diamond thickness is 3 microns or more, and is typically half the thickness of the diamond film when the thickness of the diamond layer is less than 3 micron. The value of PDI thus provides information on the number of defects created by the polishing process. These defects can be measured by evaluating the surface by standard surface and sub-surface materials characterization techniques. such as but not limited to, optical microscopy, polarization based optical microscopy, atomic force microscopy (AFM), scanning electron microscopy (SEM), transmission electron microscopy (TEM), and cathodolumiscence. Each discrete defect is numerically counted for this measurement.

The value of PDI provided by disclosed methods is generally below $10^9/cm^2$, such as $<10^5/cm^2$. PDI values below $10^6/cm^2$ correspond to substantially reduced surface and sub-surface damage as compared to results provided by conventional diamond polishing methods. Under certain disclosed polishing conditions the PDI value can be below $10^3/cm^2$, including below $10^2/cm^2$.

Generally all materials are considered softer than diamond. Examples of softer materials include silica, alumina, zirconia, silicon nitride, silicon carbide, boron carbide, boron nitride or other nitrides, carbides, and oxides, and their mixtures and compounds. The concentration of particles in the slurry can vary from 0.01 weight percent to 80 weight percent. The size of non-diamond particles can vary from 2 nm to 500 microns. As noted above, mixed particles can comprise coated diamond particles mixed with non-diamond particles. The particles can also comprise diamond particles averaging less than (<) 2 µm in size.

For polishing of diamond films and bulk diamond materials with coated diamond particles as noted above, the diamond particles can be coated with insoluble compounds (insoluble in the slurry), surfactants, or other additives. The coated particles help decrease sub-surface damage and thus PDI, and can enhance the dispersion of the particles in the slurry. In case of coated diamond particles, and other particles softer than diamond, the particle size can range from 2 nm to 500 microns, the particle concentration can range from 0.1 weight percent to 80 weight percent. The thickness of the coating can vary from 0.5 nm to 100 microns. The coatings can be continuous or discontinuous. In the case of discontinuous coatings, the area coverage is generally greater than 1 percent, typically greater than 10%.

The oxidizer can include a per-compound, or comprise a transition metal with an oxidation state of at least 3. A per-based compound is a compound that includes an element in its highest oxidation state. Some per-based oxidizer compounds include transition metal elements, such as permanganate and non-transition elements such as perchlorate. Furthermore, the slurry can contain transition metal ions in a concentration less than 3M, or chelating agents such as EDTA, corrosion inhibitors such azoles, and amines. Examples of transition metal element based oxidizers include, but are not limited to, cerium, manganese, chromium, titanium, iron, cobalt, copper, zinc, nickel, and vanadium.

Examples of per-compound oxidizers includes Potassium Permanganate: ($KMnO_4$), sodium Permanganate ($NaMnO_4$), Potassium Perchlorate ($KClO_4$), Potassium Periodate ($KIO_4$), Potassium Perbromate ($KBrO_4$), Potassium Peroxide ($K_2O_2$), Potassium Peroxoborate ($KBO_3$), Potassium Peroxochromate ($K_3CrO_8$), Potassium Peroxodicarbonate ($K_2C_2O_6$), Potassium Peroxodisulfate ($K_2S_2O_8$), Potassium Perrhenate ($KReO_4$), Potassium peroxymonosulfate ($KHSO_5$), Potassium Ortho Periodate ($K_5IO_5$), and Potassium peroxomonosulfate (or Peroxymonosulfate) ($K_2SO_5$). The oxidation state of manganese in permanganate is +7, which is the highest oxidation state for manganese. Similarly the oxidation state for chlorine in chlorate is +7, which is its highest oxidation state. The oxidation state of the transition metal or per-based oxidizer can be at least +3, or higher. Examples of +3 or higher oxidation state transition metals include $V^{3+, 4+, 5+}$, $Ti^{3+, 4+}$, $Cr^{3+, 6+}$, $Mn^{+3+, 4+, 7+}$, $Fe^{3+}$, $Ni^{3+}$, $Co^{3+}$, $Mo^{3+, 4+, 5+, 6+}$, $Ru^{3+, 4+}$, $Pd^{4+}$, $Ta^{4+, 5+}$, $W^{6+}$, $Re^{4+, 6+, 7+}$, $Au^{3+}$, and $Zr^{4+}$. A mixture of oxidizers can also be used. The concentration of oxidizers can vary from 0.001 weight percent to maximum solubility of the oxidizer at an elevated temperature (e.g., 70° C.).

Optionally the slurry can include a salt, and/or a surfactant or a surface active polymer. The surfactant can be ionic or non-ionic, while the surface active polymer generally has a molecular weight exceeding 500 Daltons. The surfactants and polymer can help in variety of ways to achieve disclosed smooth diamond surface. By adsorbing on to the surface of particles including diamond particles in one embodiment, the surfactants or polymer decrease the friction of the polishing process thus decreasing the probability of catastrophic delamination of the diamond film. Furthermore the surfactants or polymer by absorbing on the surface of the diamond, increases the final smoothness of the polished diamond surface. Finally the surfactant or polymer can increase the stability of the particles in the slurry thereby leading to more uniform polishing process.

A variety of surfactants can also be added to disclosed slurries. Surfactants can either be cationic, anionic, zwitterionic or non-ionic. The surfactants can be used individually or in a mixed state. A list of surfactants that can be used with the invention are provided in a book by M. J. Rosen, Surfactants and Interfacial Phenomena, John Wiley & Sons, 1989, hereinafter Rosen, on pages 3-32, 52-54, 70-80, 122-132, and 398-401. The concentration of surfactants can vary from 0.001 times its critical micelle concentration (CMC) to 100 times its CMC.

The slurry may also include other additives including salts, biocides, pH stabilizing agents, and soluble ions of various elements including alkali and transitions metals. For example, the salt can comprise KI, KBr, $KCO_3$, KCl, $NH_4I$ or $NH_4Cl$. The concentration of the salt can range from 0.001M to 5M.

Step 102 comprises pressing the diamond surface with a pad comprising of a metal, metal ceramic composite, metal polymeric composite, diamond particle impregnated metal, soft cloth, woolen pad or polymeric polishing pad having the slurry in between while rotating the pad relative to the diamond surface to form a smooth diamond surface. The pad has a Shore D Hardness less than 99.

If the thickness of the diamond films is less than 20 microns (a thin diamond film), for example 18 microns, delamination of the thin diamond film from the substrate during the polishing process can become more prevalent. Although generally any polishing pad can also be used in this case, it can be helpful for reducing delamination to use a cloth, woolen or resin pads, or soft polymeric pad with a Shore D hardness not exceeding 99, typically <90. The polymeric pads can comprise polyurethane-based compounds, or other crosslinked polymers. The pads can be also composite of these materials. To further reduce delamination effects for thin diamond films, a surfactant can be added to the slurry and a soft polymeric, woolen, or cloth, or resin based polishing pads can be used. Such a polishing pad may or may not be impregnated with particles, such as diamond particles.

The pad pressure can range from 0.5 psi to less than 500 psi. In some embodiments the polishing pressure used is less than 10 psi, such as from 1 psi to 8 psi. At pressures in the lower end of the range, the removal rates are lower. The removal rate at the higher end of the range is higher, however diamond films may delaminate under these conditions. The linear velocity can range from 0.05 m/sec to 100 m/sec. At lower velocities the removal rate is low compared to higher end of the range (>1 m/sec). However at higher linear speeds the films may delaminate or the pad may be eroded at a much higher rate. As the polymeric pad is viscoelastic in nature, the low linear velocities also help the pad to deform to the curvature of the diamond film on the substrate. The rotation speed can range from 5 rpm to 5000 rpm during the polishing process. The removal rate is expected to increase with higher rpm's, however at higher rpm the pad may not be able to deform to polished bowed surfaces or it may be eroded very rapidly. CMP is generally performed at a temperature ≤70° C., such as <40° C. (e.g., in a temperature range of 20 to 30° C. (room temperature)). The diamond surface can also be exposed to radiation in a wavelength range from the infrared to the ultraviolet during CMP.

As noted above, the polishing pad can be a soft cloth or woolen pad, or soft polymeric pad with Shore D Hardness less than 99, typically <90. Optionally, the pad can comprise two or more layers with the hardness of the layer contacting the diamond substrate surface to be at least a Shore D hardness 10 greater than the non-contacting polymer layers. The thickness of the polymer pad can be at least 0.05 mm to up to about 20 mm.

The polishing pad can comprise a metal. In this embodiment, the metal pad can generally comprise any metal ranging with a Knoop hardness of 50 kg/mm$^2$ to 1500 kg/mm$^2$. Examples of metal pads include metal surfaces made of tin, copper, iron, steel, brass etc. Examples of ceramic pads include, alumina, titania, zirconia or, carbides, silicon nitride and other nitrides. Optionally the metal, ceramic or polymeric pad may be impregnated with particles ranging in hardness from diamond (Knoop hardness 10,000 kg/mm$^2$) to soft metallic or ceramic particles with hardness greater than 100 kg/mm$^2$. Optionally resin bonded pads may be used with or without impregnated said particles. Particles impregnated in the polishing pad can help to increase the abrasive nature of the pad, and thus can accelerate the removal rate of the slurry. The resin bonded pads can include metal or ceramic powders such as copper, tin, antimony, etc. The metal pad can comprise a single phase of metal or metal alloy such as brass, cast iron, tin, copper, and alloys or composites.

In some embodiments, the polishing pad comprises a soft and porous polymer. For example, the material of the soft polymer polishing pad can have a density less than 0.8 g/cm$^3$ or a hardness less than 90 SHORE D, such as polyethylene. Example of soft polymeric pads include the D100™ pad provided by Cabot Microelectronics (Aurora, Ill.), the SUBA™ 4 and IC1000™ pad provided by Rodel, Inc (Phoenix, Ariz.). The SUBA™ 4 pad is a polyurethane impregnated polyester felt pad, and the IC1000™ pad is a perforated polyurethane hard top polishing pad. When polishing diamond thin or thick films and polycrystalline or single crystal bulk diamond materials or a composite diamond material, a soft pad (woolen, cloth, resin, or polymer) defined herein to have a Shore D hardness less than 99, diamond particle or diamond coated particle or mixed particles (diamond and other particles) of size ranging from 2 nm to 500 microns can be used.

As noted above, the CMP methods disclosed herein may be based on the in-situ catalytic breakdown of the oxidizing agent which provides reactive species which increases the diamond removal rate. The catalytic action can be further enhanced by use of a temperature above room temperature (e.g., 35 to 90° C.), rubbing action during the CMP process, the presence of insoluble compounds and elements of transition metals, coating of the surface of slurry particles with insoluble elements or compounds of transition metals, the presence of soluble transition metal ions, an increase in friction during polishing, formation of insoluble transition metal compound during polishing as a result of breakdown of the oxidizer, coating of the polishing pad surface with a transition metal oxide or an insoluble compound, or illuminating the polishing process with a optical lamp whose radiation output can be varied in wavelength range from ultraviolet to the infrared.

The catalytic action can be accelerated by a local temperature increase that can occur during the polishing process itself. In another embodiment, the temperature can be increased by providing an external heat source, such as a heated slurry, heating of the pad and polishing apparatus using lamps, or a resistively heated source. The catalytic action can be accelerated also by the presence of soluble ions (e.g., transition metal ions of manganese, zinc, chromium, iron, cobalt, copper), insoluble soft surface compositions (e.g., transition metal (Mn, Cu, Zn, Co, Fe, Ni) oxides, nitrides, chlorides, sulfates, nitrates carbonates (e.g., $MnO_2$, $MnCl_3$, $TiO_2$, CuO), or transition metals (Fe, Mn, Zn, Co, Ag)) during the polishing process.

If the thickness of the diamond film is less than 20 microns (defined as diamond thin films), for example 15 microns, issues of delamination of the film from the substrate can become more prevalent. In this case particles in the slurry of any size or any hardness, and composition, and concentration can be used in the slurry. However in one embodiment the slurry comprises of plurality of non-diamond particles (hardness 100 kg/mm$^2$ to 1000 kg/mm$^2$, size 2 nm to 500 microns, concentration 0.01 weight % to 80 weight percent), and/or diamond particles limited to size less than 2 microns, an oxidizer containing a per compound or transition metal element, and an acid so that the pH of the slurry is less than 3, such as 1.5 to 3.

Diamond films grown on various substrates are expected to cause significant curvature of the substrates. The curvature arises due to intrinsic growth and thermal mismatch stresses that may lead to curvature of the diamond film containing substrate. To ensure that the diamond films containing substrate is polished uniformly across the wafer, a polymeric pad with Shore D hardness less than 99 or composite pad and thickness ranging from 1 micron to 10 cm can be used. Due to prior or mechanical polishing hard diamond polishing the density of defects in the near surface regions (up to 5 microns) is higher than the bulk of the material. The partial or whole reduction of these defects represents removal of sub-surface damage. The partial or whole removal of the scratches and surface defects from the near surface regions represents removal of sub-surface damage.

FIG. 2 is a cross sectional schematic view of an article 200 comprising a substrate 201, a diamond layer 202 having a smooth diamond surface 203 on the substrate 201, and a capping layer 205 comprising a diamond or a semiconductor on the smooth diamond surface 203. A plurality of electronic devices (e.g., transistors) 208 are formed in or on the capping layer 205. Substrate 201 can comprise various substrates including silicon, diamond, GaN, AlGaN or SiC. When the capping layer 205 comprises a semiconductor, the semiconductor can comprise semiconductors including silicon, GaN, AlGaN, SiC, or TiN. In one embodiment the diamond layer 202 comprises cobalt-diamond, nickel-diamond, or diamond particles protruding from a matrix comprising metals or ceramics, such nickel or tungsten carbide. In another embodiment the substrate 201 comprises a single crystal diamond substrate that includes the diamond layer 202 having a smooth diamond surface 203.

The smooth diamond surface 203 has (i) rms surface roughness less than (<) 15 nm for an average grain size greater than (>) 0.5 μm, an rms surface roughness less than (<) 10 nm for an average grain size between 50 nm and 0.5 μm, and an rms surface roughness less than (<) 5 nm for an average grain size less than (<) 50 nm, and (ii) a polishing damage index (PDI) of less than (<) $10^9$ per $cm^2$. In one embodiment where the average grain size is greater than (>) 100 nm, the PDI is less than (<) $10^6/cm^2$ and the rms surface roughness is less than (<) 1 nm.

Electronic devices 208 can benefit from the high thermal conductivity of the diamond layer 202 as well as the capping layer 205 when the capping layer 205 comprises a diamond layer, which can provide a heat spreading function to help dissipate heat generated by the electronic devices 208 during operation. In another embodiment the diamond layer 202 is a patterned layer comprising a plurality of diamond islands.

EXAMPLES

Disclosed embodiments are further illustrated by the following specific Examples, which should not be construed as limiting the scope or content of the disclosed embodiments in any way. The temperature used was approximately 25° C. for all Examples.

Example 1

Diamond samples having different thickness were polished with a CMP slurry composition that comprised i) a liquid (e.g. water) carrier, and an oxidizer comprising the transition metal per-compound potassium permanganate. Experiments performed using Buehler Ecomet 4/Automet 2 polisher. The potassium permanganate oxidizer concentration was 0.4 molar, and 10% alumina particles with a particle size of around 300 nm were used. Nitric acid ($HNO_3$) was included to provide a pH for the slurry of 2. The polishing parameters used for polishing was pressure 10 psi, pad linear velocity 1 m/sec, and an IC1000 pad polymeric pad composed of polyurethane.

| S.No | Type of Diamond Sample | Material Removal rate | RMS roughness of surface after polishing | Subsurface damage/ Scratches |
|---|---|---|---|---|
| 1 | Thin film (300 nm) | 100 nm/hr | 7 A | No |
| 2 | Thick film (Thickness film 100 micron) | 80 nm/hr | 3 A | No |
| 3 | Bulk sample (300 microns) | 70 nm/hr | 1 A | No |
| 4 | Diamond Composite | 30 nm/hr | 30 nm | No |
| 5 | (111) Diamond | <10 nm/hr | 3 A | No |

Example 2

Diamond samples having different crystallite size were polished with a CMP slurry composition that comprised i) a liquid (e.g. water) carrier, and an oxidizer being the per-compound potassium permanganate or potassium persulfate. Experiments were performed using Buehler Ecomet 4 and Automet 2 polisher. The oxidizer concentration was 0.4 mole/liter, and 10% Alumina particles with a particle size of 300 nm, or 0.25 μm diamond particles with a concentration of 2 percent, or a mixture of both, was used. Nitric acid was used to adjust the pH of the slurry to 2. The polishing parameters used for polishing was pressure 10 psi, pad linear velocity 1 m/sec, and a Cabot D100 pad. The polishing runs were conducted for 200 minutes.

| S. No | Type of Diamond Sample | Particles in the slurry | Removal rate | RMS of surface after polishing | Subsurface damage/ scratches |
|---|---|---|---|---|---|
| 1 | Super Nano-Crystalline diamond (grain size 5 nm) | Alumina | 100 nm/hr | 5 A | No |
| 2 | Nano-Crystalline diamond (grain size 250 nm) | Alumina | 120 nm/hr | 3 A | No |
| 3 | Micro-crystalline diamond (1/4 micron to 25 micron) | Alumina | 80 nm/hr | 25 A | No |
| 4 | Large grain diamonds (25 to 100 micron) | Alumina | 70 nm/hr | 35 A | No |
| 5 | Single crystalline sample | 1/4 micron diamond | 25 nm/hr | 1.5 A | Yes |
| 6 | Single crystal diamond | 1/4 micron diamond + Alumina | 75 | 1.5 A | Yes |
| 7 | Diamond-Cobalt composite | Alumina | 30 nm/hr | 30 nm | No |

Example 3

A diamond 1 cm×1 cm microcrystalline sample was polished with a CMP slurry composition that comprised of i) a liquid (e.g. water) carrier, and an oxidizer being the per-compound potassium persulfate. Experiments were performed using Buehler Ecomet 4 and Automet 2 polisher. The oxidizer concentration was 0.4 molar, and the particles were 2%, 0.25 micron diamond particle. Nitric acid was used to provide a pH of 2. The polishing parameters using for polishing was pressure 10 psi, pad linear velocity 1 m/sec, on different pads as described below. The polishing runs were conducted for 60 minutes.

| S. No | Type of Pads | Removal rate | Type of Pad |
|---|---|---|---|
| 1 | Politex | 20 nm/hr | Polymer |
| 2 | Suba IV | 40 nm/hr | Polymer |
| 3 | D100 | 210 nm/hr | Polymer |
| 4 | IC 1000 | 240 nm/hr | Polymer |
| 5 | Cast Iron disc | 280 nm/hr | Metal |
| 6 | Ceramic Disc | 300 nm/hr | Ceramic |
| 7 | Resin bonded copper pad | 300 nm/hr | Metal |
| 8 | Diamond impregnated metal pad | 300 nm/hr | Metal |

Example 4

A diamond 1 cm×1 cm polycrystalline sample was polished with a CMP slurry composition that comprised i) a liquid (e.g. water) carrier, and an oxidizer being selected from the per-compounds shown in table below. Experiments were performed using Buehler Ecomet 4/Automet 2 polisher. Different oxidizer with concentration of 0.4 mole/liter along with 2%, ¼ μm average size diamond particles were used in the slurry for polishing. Nitric acid was used to change the pH of the slurry to 2. The polishing parameters used for polishing were pressure 10 psi, pad linear velocity 1 m/sec, on an IC1000 pad. The polishing runs were conducted for 60 minutes.

| S. No | Per-compound oxidizer | Removal rate |
|---|---|---|
| 1 | Potassium Permanganate | 140 nm/hr |
| 2 | Potassium Peroxymonosulfate | 180 nm/hr |
| 3 | Potassium perfsulfate | 240 nm/hr |
| 4 | Hydrogen peroxide | 140 nm/hr |
| 5 | Potassium Periodate | 140 nm/hr |
| 6 | Sodium Hypochlorite | 140 nm/hr |

Example 5

A diamond 1 cm×1 cm polycrystalline sample was polished with a CMP slurry composition that comprised i) a liquid (e.g. water) carrier, and an oxidizer with the per-compound potassium persulfate. Experiments were performed using Buehler Ecomet 4 and Automet 2 polisher. The oxidizer concentration was 0.2 mole/liter and different slurry particles listed in table below were used. Nitric acid was used to change the pH of the slurry to 2. The polishing parameters used for polishing was pressure 10 psi, pad linear velocity 1 m/sec, on an IC1000 pad. The polishing runs were conducted for 60 minutes.

| Particles | Removal rate |
|---|---|
| 10% Silica (135 nm) | 10 nm/hr |
| 10% Silicon carbide (8 micron) | 60 nm/hr |
| 10% Alumina (800 nm) | 50 nm/hr |

Example 6

A diamond 1 cm×1 cm polycrystalline sample was contacted with a CMP slurry composition that comprised of i) a liquid (e.g. water) carrier, and an oxidizer with a per-compound persulfate. Experiments performed using polisher from Buehler Ecomet 4 and Automet 2 polisher. The oxidizer concentration was 0.2 mole/liter, different particles coated with transition metal oxide ($MnO_2$) listed in table below were used. The polishing parameters used were pressure 10 psi, pad linear velocity 1 m/sec, on an IC1000 pad. The polishing runs were conducted for 60 minutes.

| Particles | Removal rate |
|---|---|
| 10% Silica (135 nm) | 15 nm/hr |
| 10% Silicon carbide (4-8 micron) | 70 nm/hr |
| Alumina (300 nm) | 60 nm/hr |
| 1 micron diamond | 300 nm/hr |

Example 7

A diamond 1 cm×1 cm polycrystalline sample was polished with a CMP slurry composition that comprises of i) a liquid (e.g. water) carrier and an oxidizer with compound of a per-compound potassium persulfate. Experiments were performed using Buehler Ecomet 4 and Automet 2 polisher. The oxidizer concentration was 0.2 molar, and 1% 1 micron diamond particles and different surfactants listed in the table were used. The polishing parameters used were pressure 10 psi, pad linear velocity 1 m/sec, and an IC1000 pad was used. The polishing runs were conducted for 60 minutes.

| Surfactant | Removal rate |
|---|---|
| 0.1 wt % secondary alkane sulphonate sodium salt | 260 nm/hr |
| 0.1 wt % Poly Acrylic acid | 180 nm/hr |
| 0.1 wt % CTAB | 240 nm/hr |
| 0.1 wt % Sodium dodecyl sulphate | 160 nm/hr |

Example 8

A diamond 1 cm×1 cm polycrystalline sample was polished with a CMP slurry composition that comprises of i) a liquid (e.g. water) carrier, and an oxidizer with a per-compound permanganate. Experiments were performed using Buehler Ecomet 4 and Automet 2 polisher. The oxidizer concentration was 0.2 molar, and 1% ¼ micron diamond particles were used. The polishing pressure was 5 psi and the pad linear velocity was 1 m/sec, and a Cabot D100 pad was used for experiments. The polishing runs were conducted for 60 minutes with different slurry pH as shown in table below:

| pH of the Slurry | Removal rate |
|---|---|
| 1 | 90 nm/hr |
| 2 | 60 nm/hr |
| 3 | 60 nm/hr |
| 5 | 20 nm/hr |
| 9 | 20 nm/hr |
| 12 | 20 nm/hr |
| 13 | 20 nm/hr |

Example 9

Diamond particles protruding from a metal plate (>4 inch in diameter) was polished with a CMP slurry composition that comprises of i) a liquid (e.g. water) carrier, and an oxidizer with the per-compound potassium persulfate. Experiments were performed using Buehler Ecomet 4 and Automet 2 polisher. The oxidizer concentration was 0.2 molar, with 1% ¼ micron diamond slurry particles. The polishing pressure was 5 psi, the pad linear velocity 1 m/sec, and a Cabot D100 pad was used. The polishing runs were conducted for 60 minutes. The diamond particles protruding from the metal plate had a height between 10 micron and 500 micron. The polishing rate of the diamond particles was 100 nm/hr.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method of chemical mechanical polishing (CMP) a diamond surface comprising:

providing a slurry comprising a plurality of particles, at least one oxidizer, and at least one acid or base, wherein said slurry has a pH less than or equal to (≤) 3 or greater (>) than 11, wherein at least an outer surface of said plurality of particles is softer than said diamond surface or said plurality of particles are diamond particles averaging less than (<) 2 μm in size;

pressing said diamond surface with a pad having a Shore D Hardness less than (<) 99 having said slurry in between while rotating said pad relative to said diamond surface to form a smooth diamond surface having a root mean square (rms) surface roughness less than 15 nm.

2. The method of claim 1, wherein said pad comprises a soft cloth, metallic woolen pad or polymeric polishing pad with said Shore D hardness less than (<) 90.

3. The method of claim 1, wherein said plurality of particles comprise alumina, titania or silica.

4. The method of claim 1, wherein said oxidizer comprises a transition metal compound or a per compound.

5. The method of claim 4, wherein said oxidizer comprises $KMnO_4$ or a $K_2S_2O_8$ compound.

6. The method of claim 1, wherein said diamond surface is a composite of cobalt-diamond or nickel-diamond, or diamond particles protruding from a matrix.

7. The method of claim 1, wherein a polishing pressure used for said pressing is less than 10 psi.

8. The method of claim 1, wherein said slurry comprises at least one surfactant.

9. A method of chemical mechanical polishing (CMP) a diamond surface, comprising:

providing a slurry comprising a plurality of particles, wherein at least an outer surface of said plurality of particles is softer than said diamond surface, at least one oxidizer comprising a transition metal compound or a per compound, and at least one acid, wherein said slurry has a pH less than or equal to (≤) 3;

pressing said diamond surface with a soft cloth, or metallic woolen pad or polymeric polishing pad having a Shore D Hardness less than (<) 99 with said slurry in between while rotating said polishing pad relative to said diamond surface to form a smooth diamond surface having a root mean square (rms) surface roughness less than (<) 10 nm.

10. The method of claim 9, when a polishing pressure used for said pressing is less than 10 psi.

11. The method of claim 9, wherein said slurry comprises at least one surfactant.

12. The method of claim 9, wherein said rms surface roughness is less than (<) 1 nm.

* * * * *